(12) United States Patent
Hung et al.

(10) Patent No.: US 8,765,546 B1
(45) Date of Patent: Jul. 1, 2014

(54) METHOD FOR FABRICATING FIN-SHAPED FIELD-EFFECT TRANSISTOR

(71) Applicant: United Microelectronics Corp., Hsin-Chu (TW)

(72) Inventors: Ching-Wen Hung, Tainan (TW); Jia-Rong Wu, Kaohsiung (TW); Chih-Sen Huang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/925,812

(22) Filed: Jun. 24, 2013

(51) Int. Cl.
*H01L 27/088* (2006.01)

(52) U.S. Cl.
USPC ........... 438/222; 438/294; 438/478; 257/190; 257/288

(58) Field of Classification Search
USPC ................ 438/222, 478, 294; 257/190, 288
See application file for complete search history.

(56) References Cited

U.S. PATENT DOCUMENTS

| | | | |
|---|---|---|---|
| 4,891,303 A | 1/1990 | Garza |
| 5,124,276 A | 6/1992 | Samata et al. |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,530,280 A | 6/1996 | White |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,843,239 A | 12/1998 | Shrotriya |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,077,774 A | 6/2000 | Hong |
| 6,100,171 A | 8/2000 | Ishida |
| 6,110,787 A | 8/2000 | Chan |
| 6,114,259 A | 9/2000 | Sukharev |
| 6,165,826 A | 12/2000 | Chau |
| 6,165,881 A | 12/2000 | Tao |
| 6,191,052 B1 | 2/2001 | Wang |
| 6,204,192 B1 | 3/2001 | Zhao |
| 6,228,730 B1 | 5/2001 | Chen |
| 6,274,447 B1 | 8/2001 | Takasou |
| 6,303,505 B1 | 10/2001 | Ngo |
| 6,319,809 B1 | 11/2001 | Chang |
| 6,342,733 B1 | 1/2002 | Hu |
| 6,355,533 B2 | 3/2002 | Lee |
| 6,365,476 B1 | 4/2002 | Talwar |
| 6,368,926 B1 | 4/2002 | Wu |
| 6,383,950 B1 | 5/2002 | Pangrle |

(Continued)

*Primary Examiner* — Mamadou Diallo
(74) *Attorney, Agent, or Firm* — Winston Hsu; Scott Margo

(57) ABSTRACT

A method for fabricating fin-shaped field-effect transistor (FinFET) is disclosed. The method includes the steps of: providing a substrate; forming a fin-shaped structure on the substrate; forming a first gate structure on the fin-shaped structure; forming a first epitaxial layer in the fin-shaped structure adjacent to the first gate structure; forming an interlayer dielectric layer on the first gate structure and the first epitaxial layer; forming an opening in the interlayer dielectric layer to expose the first epitaxial layer; forming a silicon cap on the first epitaxial layer; and forming a contact plug in the opening.

14 Claims, 7 Drawing Sheets

(56) References Cited

U.S. PATENT DOCUMENTS

| | | |
|---|---|---|
| 6,403,471 B1 | 6/2002 | Lou |
| 6,406,978 B1 | 6/2002 | Yang |
| 6,413,854 B1 | 7/2002 | Uzoh |
| 6,424,051 B1 | 7/2002 | Shinogi |
| 6,444,591 B1 | 9/2002 | Schuegraf |
| 6,465,898 B1 | 10/2002 | Hnilo |
| 6,492,266 B1 | 12/2002 | Ngo |
| 6,518,646 B1 | 2/2003 | Hopper |
| 6,534,387 B1 | 3/2003 | Shinogi |
| 6,537,370 B1 | 3/2003 | Hernandez |
| 6,544,822 B2 | 4/2003 | Kim |
| 6,551,924 B1 | 4/2003 | Dalton |
| 6,602,801 B2 | 8/2003 | Kong |
| 6,605,498 B1 | 8/2003 | Murthy |
| 6,613,695 B2 | 9/2003 | Pomarede |
| 6,621,131 B2 | 9/2003 | Murthy |
| 6,624,066 B2 | 9/2003 | Lu |
| 6,624,068 B2 | 9/2003 | Thakar |
| 6,632,718 B1 | 10/2003 | Grider |
| 6,638,871 B2 | 10/2003 | Wang |
| 6,642,122 B1 | 11/2003 | Yu |
| 6,660,634 B1 | 12/2003 | Ngo |
| 6,664,156 B1 | 12/2003 | Ang |
| 6,676,764 B2 | 1/2004 | Joo |
| 6,690,580 B1 | 2/2004 | Goldberg |
| 6,693,043 B1 | 2/2004 | Li |
| 6,693,046 B2 | 2/2004 | Takigawa |
| 6,699,763 B2 | 3/2004 | Grider |
| 6,703,271 B2 | 3/2004 | Yeo |
| 6,713,402 B2 | 3/2004 | Smith |
| 6,720,247 B2 | 4/2004 | Kirkpatrick |
| 6,753,260 B1 | 6/2004 | Li |
| 6,756,085 B2 | 6/2004 | Waldfried |
| 6,777,275 B1 | 8/2004 | Kluth |
| 6,783,862 B2 | 8/2004 | Hedrick |
| 6,790,778 B1 | 9/2004 | Cheng |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,867,126 B1 | 3/2005 | Li |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,900,541 B1 | 5/2005 | Wang |
| 6,913,029 B2 | 7/2005 | Zorich |
| 6,930,007 B2 | 8/2005 | Bu |
| 6,933,586 B2 | 8/2005 | Fornof |
| 6,939,797 B2 | 9/2005 | Barth |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 6,992,003 B2 | 1/2006 | Spencer |
| 7,037,773 B2 | 5/2006 | Wang |
| 7,057,296 B2 | 6/2006 | Hung |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,265,056 B2 | 9/2007 | Tsai |
| 7,273,808 B1 | 9/2007 | Lin |
| 7,276,435 B1 | 10/2007 | Pozder |
| 7,288,822 B1 | 10/2007 | Ting |
| 7,303,999 B1 | 12/2007 | Sriraman |
| 7,320,945 B2 | 1/2008 | Li |
| 7,332,422 B2 | 2/2008 | Lu |
| 7,334,595 B2 | 2/2008 | Birtcher |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,504,691 B2 | 3/2009 | Park et al. |
| 7,563,705 B2 | 7/2009 | Tonegawa |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0068435 A1 | 6/2002 | Tsai |
| 2002/0119672 A1 | 8/2002 | Wu |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0058090 A1 | 3/2004 | Waldfried |
| 2004/0067631 A1 | 4/2004 | Bu |
| 2004/0219795 A1 | 11/2004 | Li |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0095840 A1 | 5/2005 | Bhanap |
| 2005/0139231 A1 | 6/2005 | Abadie |
| 2005/0142862 A1 | 6/2005 | Chun |
| 2005/0153538 A1 | 7/2005 | Tsai |
| 2005/0221020 A1 | 10/2005 | Fukiage |
| 2005/0233591 A1 | 10/2005 | Schmitt |
| 2005/0260830 A1 | 11/2005 | Kwon |
| 2005/0263892 A1 | 12/2005 | Chun |
| 2005/0285193 A1 | 12/2005 | Lee |
| 2005/0287752 A1 | 12/2005 | Nouri |
| 2006/0024968 A1 | 2/2006 | Hudson |
| 2006/0040490 A1 | 2/2006 | Chen |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0148255 A1 | 7/2006 | Lu |
| 2006/0163558 A1 | 7/2006 | Lee |
| 2006/0166011 A1 | 7/2006 | Chen |
| 2006/0199386 A1 | 9/2006 | Huang |
| 2006/0228842 A1 | 10/2006 | Zhang |
| 2006/0231826 A1 | 10/2006 | Kohyama |
| 2006/0246717 A1 | 11/2006 | Wang |
| 2006/0258126 A1 | 11/2006 | Shiono |
| 2006/0281288 A1 | 12/2006 | Kawamura |
| 2006/0292711 A1 | 12/2006 | Su |
| 2006/0292779 A1 | 12/2006 | Chen |
| 2006/0292783 A1 | 12/2006 | Lee |
| 2007/0023847 A1 | 2/2007 | Rhee |
| 2007/0032058 A1 | 2/2007 | Sung |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0077751 A1 | 4/2007 | Chen |
| 2007/0082451 A1 | 4/2007 | Samoilov |
| 2007/0117397 A1 | 5/2007 | Fu |
| 2007/0128783 A1 | 6/2007 | Ting |
| 2007/0144607 A1 | 6/2007 | Lo |
| 2007/0166929 A1 | 7/2007 | Matsumoto |
| 2007/0173070 A1 | 7/2007 | Chen |
| 2007/0184996 A1 | 8/2007 | Weng |
| 2007/0218214 A1 | 9/2007 | Lai |
| 2007/0243720 A1 | 10/2007 | Ko |
| 2007/0262396 A1 | 11/2007 | Zhu |
| 2007/0298604 A1 | 12/2007 | Liu |
| 2008/0014688 A1 | 1/2008 | Thean |
| 2008/0026579 A1 | 1/2008 | Lai |
| 2008/0061366 A1 | 3/2008 | Liu |
| 2008/0067145 A1 | 3/2008 | Wang |
| 2008/0067545 A1 | 3/2008 | Rhee |

(56) References Cited

U.S. PATENT DOCUMENTS

| | | |
|---|---|---|
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0142931 A1 | 6/2009 | Wang |
| 2009/0166625 A1 | 7/2009 | Ting |
| 2009/0176369 A1 | 7/2009 | Nickel |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0286009 A1 | 11/2009 | Lai |
| 2009/0302348 A1 | 12/2009 | Adam |
| 2010/0001317 A1 | 1/2010 | Chen |
| 2010/0018944 A1 | 1/2010 | Lai |
| 2010/0043701 A1 | 2/2010 | Lim |
| 2010/0093147 A1 | 4/2010 | Liao |
| 2010/0096726 A1 | 4/2010 | Yang |
| 2010/0289021 A1 | 11/2010 | Wu |
| 2012/0326162 A1 | 12/2012 | Lin et al. |
| 2013/0032883 A1 | 2/2013 | Chan et al. |
| 2013/0228825 A1* | 9/2013 | Xu ................................. 257/190 |
| 2013/0228862 A1* | 9/2013 | Lee et al. ....................... 257/347 |
| 2013/0252349 A1* | 9/2013 | Pradhan et al. ................... 438/4 |
| 2013/0285208 A1* | 10/2013 | Standaert et al. ............... 257/546 |
| 2013/0299894 A1* | 11/2013 | Sakuma et al. ................. 257/326 |
| 2013/0306967 A1* | 11/2013 | Hoentschel et al. ............ 257/48 |
| 2013/0341638 A1* | 12/2013 | Liao et al. ........................ 257/77 |
| 2014/0065782 A1* | 3/2014 | Lu et al. .......................... 438/294 |

* cited by examiner

METHOD FOR FABRICATING FIN-SHAPED FIELD-EFFECT TRANSISTOR

BACKGROUND OF THE INVENTION

1. Field of the Invention

The invention relates to a method for fabricating fin-shaped field effect transistor (FinFET), and more particularly to a method of forming silicon cap after forming contact vias and exposing the epitaxial layer.

2. Description of the Prior Art

In recent years, as various kinds of consumer electronic products have continuously improved and been miniaturized, the size of semiconductor components has reduced accordingly, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In conventional process for fabricating FinFETs, formation of a silicon cap is typically performed as soon as epitaxial layers are formed. However, this approach often causes bump issues on surface of the polysilicon gate. Moreover, during the fabrication of salicides, problems such as encroachment is caused on the liner between the gate and the spacer as a result of wet clean, which further results in nickel silicide piping. Hence, how to improve the current process to resolve the aforementioned issues has become an important task in this field.

SUMMARY OF THE INVENTION

According to a preferred embodiment of the present invention, a method for fabricating fin-shaped field-effect transistor (FinFET) is disclosed. The method includes the steps of: providing a substrate; forming a fin-shaped structure on the substrate; forming a first gate structure on the fin-shaped structure; forming a first epitaxial layer in the fin-shaped structure adjacent to the first gate structure; forming an interlayer dielectric layer on the first gate structure and the first epitaxial layer; forming an opening in the interlayer dielectric layer to expose the first epitaxial layer; forming a silicon cap on the first epitaxial layer; and forming a contact plug in the opening.

These and other objectives of the present invention will no doubt become obvious to those of ordinary skill in the art after reading the following detailed description of the preferred embodiment that is illustrated in the various figures and drawings.

Figure 1:
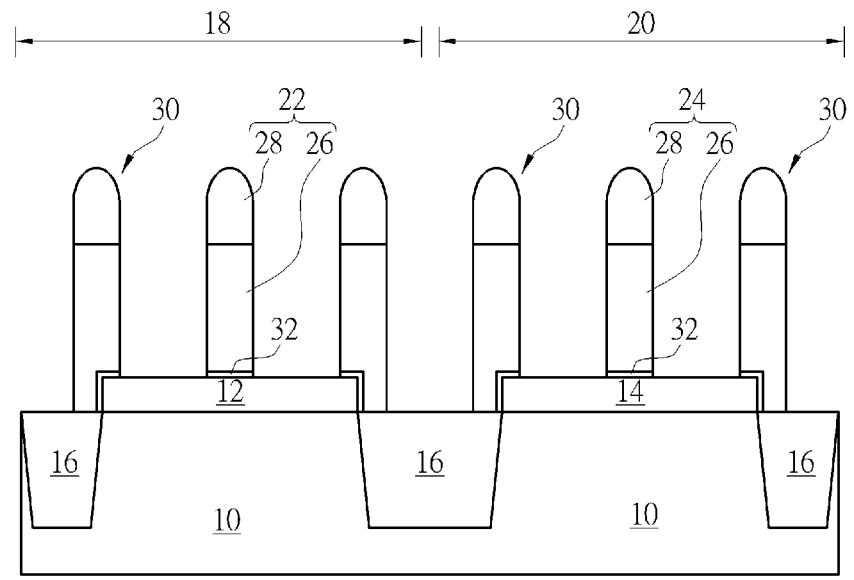
FIGS. 1-14 illustrate a method for fabricating FinFET according to a preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Referring FIG. 1-14, FIGS. 1-14 illustrate a method for fabricating a semiconductor device, such as a FinFET according to a preferred embodiment of the present invention. As shown in FIG. 1, a substrate 10, such as a silicon substrate or a silicon-on-insulator (SOI) substrate is provided. A first transistor region, such as a PMOS region 18 and a second transistor region, such as a NMOS region 20 is defined on the substrate 10.

At least a first fin-shaped structure 12, at least a second fin-shaped structure 14, and an insulating layer 16 are formed on the substrate 10. The bottom of the fin-shapes structures 12, 14 is preferably enclosed by the insulating layer 16, such as silicon oxide to form a shallow trench isolation (STI). A first gate structure 22 and a second gate structure 24 are formed on part of the first fin-shaped structure 12 and the second fin-shaped structure 14 respectively. Each of the first gate structure 22 and the second gate structure 24 includes a gate electrode 26 and a hard mask 28 disposed on the gate electrode 26, and a plurality of dummy gates 30 could be formed selectively adjacent to the first gate structure 22 and the second gate structure 24. In the transistor device formed afterwards, the regions of the fin-shaped structures 12, 14 overlapped by the gate electrodes 26 could be used as a channel for carrier flow.

The formation of the first fin-shaped structure 12 and the second fin-shaped structure 14 could include first forming a patterned mask (now shown) on the substrate, 10, and an etching process is performed to transfer the pattern of the patterned mask to the substrate 10. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer 16 surrounding the bottom of the fin-shaped structures 12, 14. Alternatively, the formation of the first fin-shaped structure 12 and the second fin-shaped structure 14 could also be accomplished by first forming a patterned hard mask (not shown) on the substrate 10, and then performing an epitaxial process on the exposed substrate 10 through the patterned hard mask to grow a semiconductor layer. This semiconductor layer could then be used as the corresponding fin-shaped structures 12, 14. In another fashion, the patterned hard mask could be removed selectively or retained, and deposition, CMP, and then etching back could be used to form an insulating layer 16 to surround the bottom of the fin-shaped structures 12, 14. Moreover, if the substrate 10 is a SOI substrate, a patterned mask could be used to etch a semiconductor layer on the substrate until reaching a bottom oxide layer underneath the semiconductor layer to form the corresponding fin-shaped structures. If this means is chosen the aforementioned steps for fabricating the insulating layer 16 could be eliminated.

Preferably a gate dielectric layer 32 is formed between the gate electrodes 26 and the fin-shaped structures 12, 14. The gate electrodes 26 are preferably consisted of doped or non-doped polysilicon, but could also be selected from a material consisting silicide of metals. The gate dielectric layer 32 is preferably consisting of a silicon layer, such as SiO, SiN, or SiON, but could also be selected from dielectric materials having high-k dielectric properties.

Figure 2:
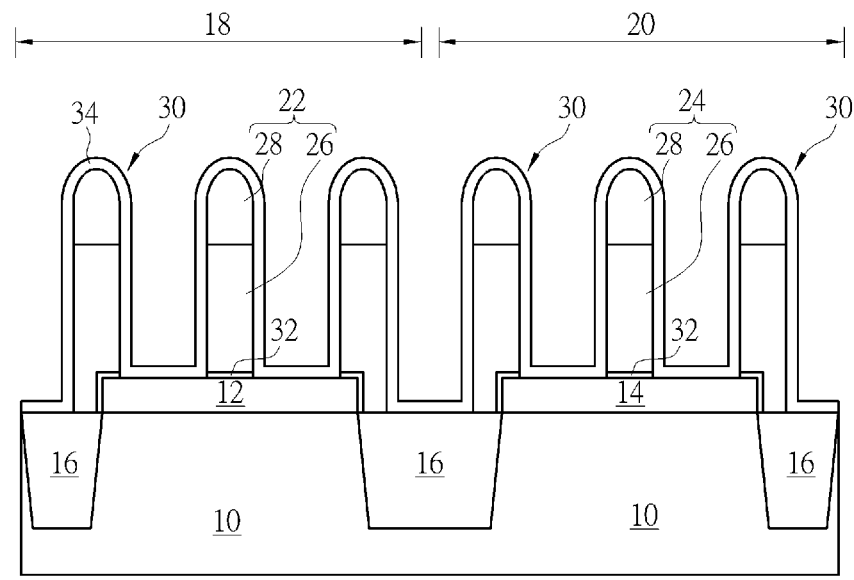

Next, as shown in FIG. 2, a first hard mask 34 is formed entirely to cover the first gate structure 22 and the second gate structure 24. According to a preferred embodiment of the present invention, the first hard mask 34 is selected from a group consisting of SiC, SiON, SiN, SiCN, and SiBN, but not limited thereto.

Figure 3:
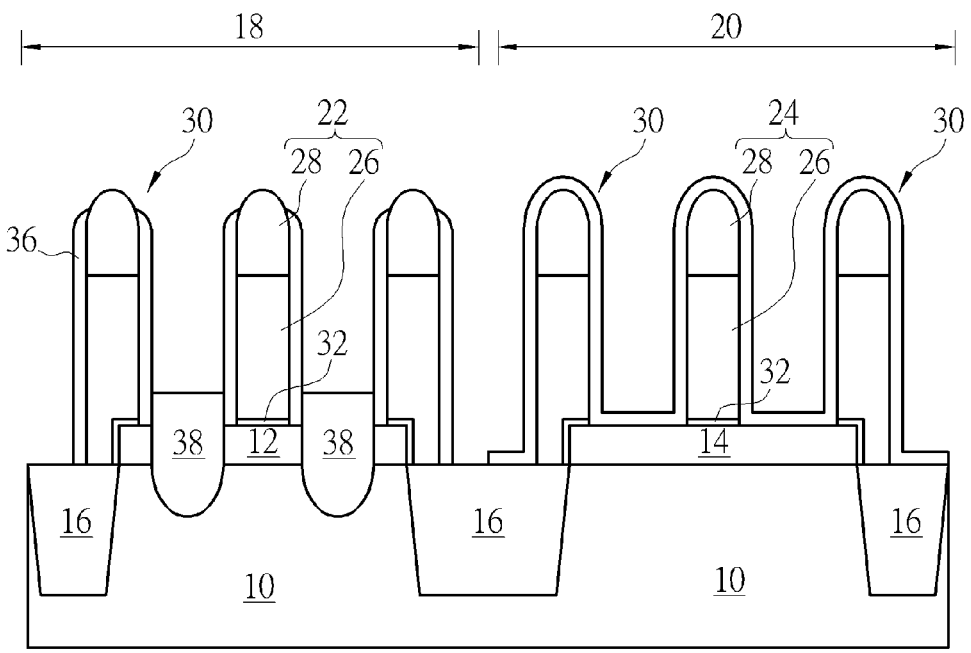

As shown in FIG. 3, a patterned resist (not shown) is formed in the NMOS region 20, and a portion of the first hard mask 34 in the PMOS region 18 is removed by using the patterned resist as a mask to form a first spacer 36 around the first gate structure 22 and a first recess (not shown) in the first fin-shaped structure 12 adjacent to the first gate structure 22. After stripping the patterned resist from the NMOS region 20, a selective epitaxial growth is carried out to form a first epitaxial layer 38 composed of silicon germanium in the first recess.

Figure 4:
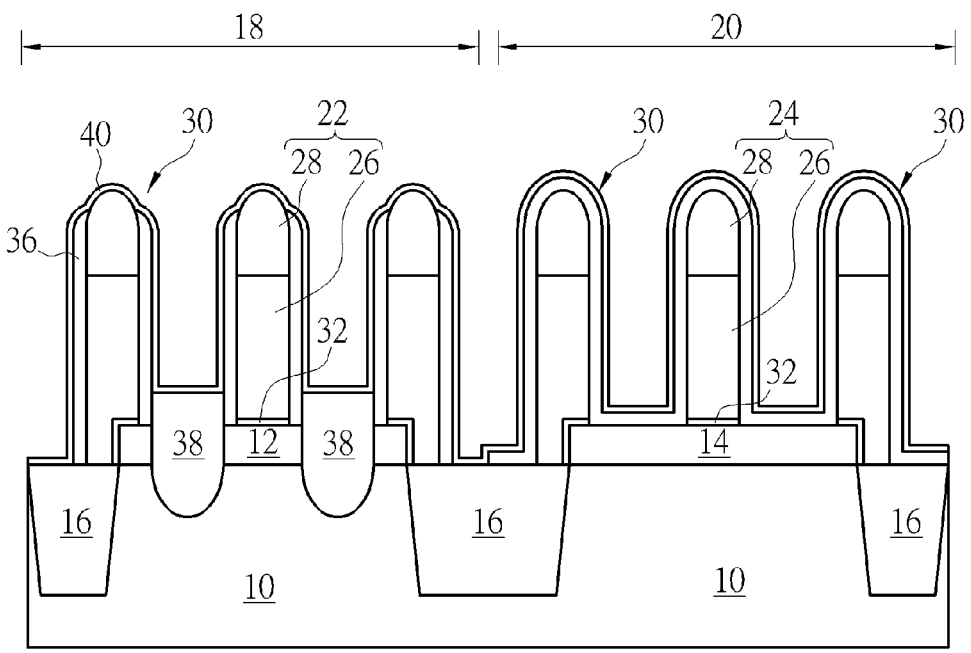

Next, as shown in FIG. 4, a second hard mask 40 is formed entirely to cover the first gate structure 22 and the second gate structure 24, and part of the first hard mask 34 of the NMOS region 20. According to a preferred embodiment of the present invention, the second hard mask 40 is selected from a group consisting of SiC, SiON, SiN, SiCN, and SiBN, but not limited thereto.

Figure 5:
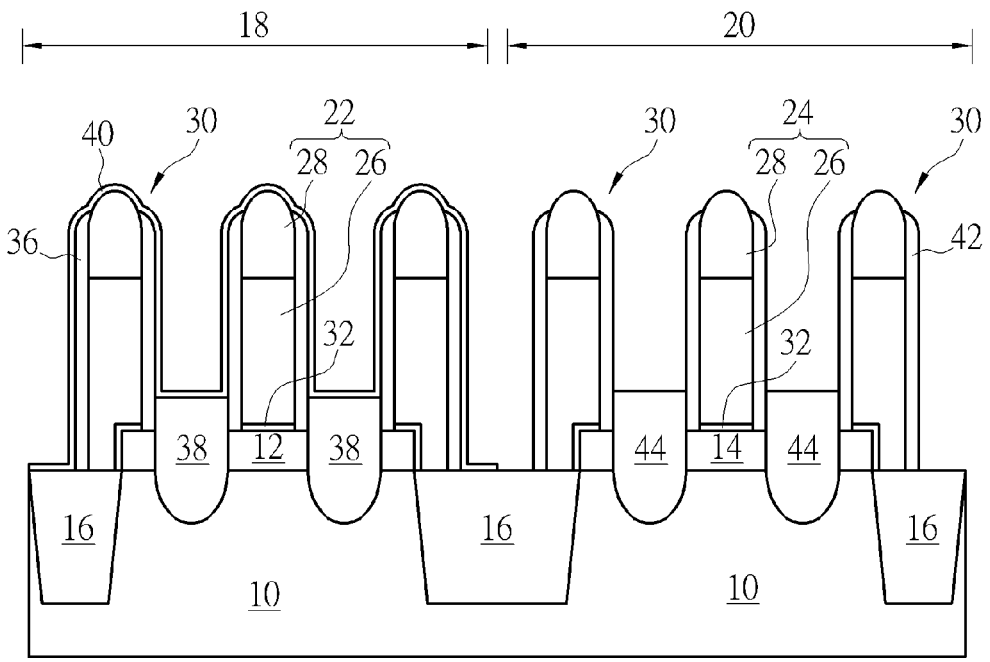

Next, as shown in FIG. 5, a patterned resist (not shown) is formed in the PMOS region 18, and part of or all of the second hard mask 40 in the NMOS region 20 is removed by using the patterned resist as a mask to form another first spacer 42 around the second gate structure 24 and a second recess (not shown) in the second fin-shaped structure 14 adjacent to the second gate structure 22. After stripping the patterned resist from the PMOS region 18, a selective epitaxial growth is conducted to form a second epitaxial layer 44 composed of silicon phosphorus (SiP) in the second recess.

Figure 6:
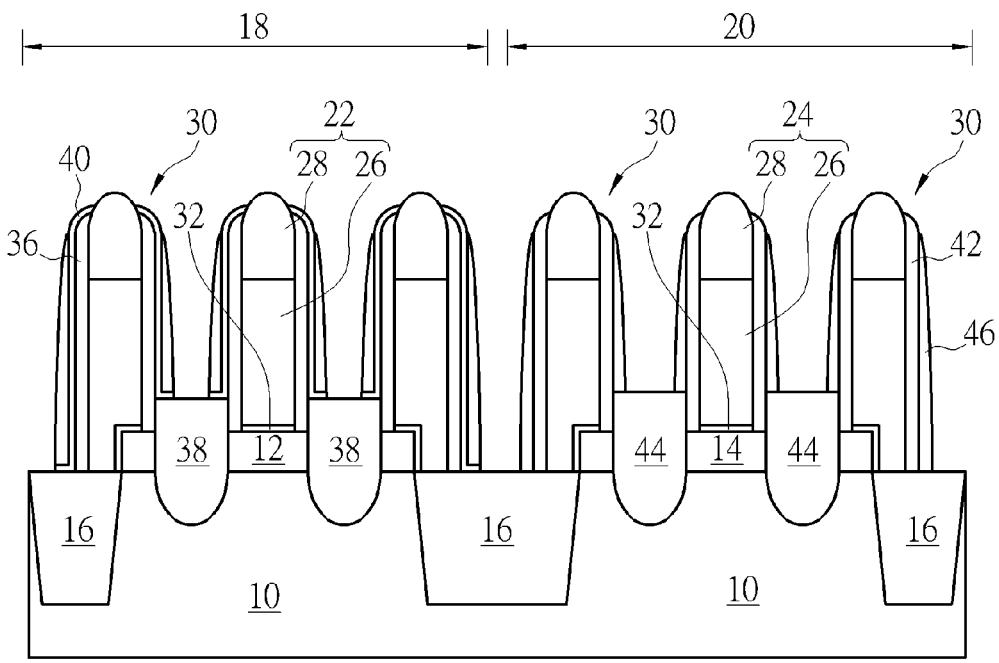

Next, as shown in FIG. 6, a second spacer 46 is formed around the first gate structure 22 and the second gate structure 24. The steps for forming the second spacer 46 could be similar to the aforementioned process for forming the first spacers 36, 42 and the details of which are not described herein for the sake of brevity. It should be noted that even if a second spacer 46 is formed directly on the sidewall of the first spacers 36, 42, the first spacers 36, 42 could also be removed before the formation of the second spacer 46 so that the second spacer 46 would be formed directly on the sidewall of the first and second gate structures 22, 24. This approach is also within the scope of the present invention.

Figure 7:
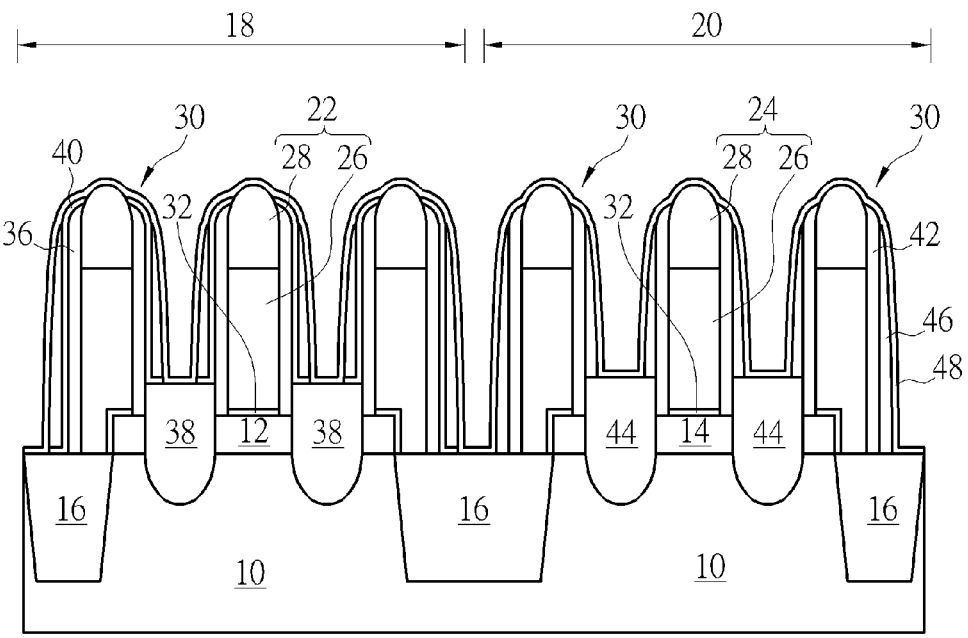
Figure 8:
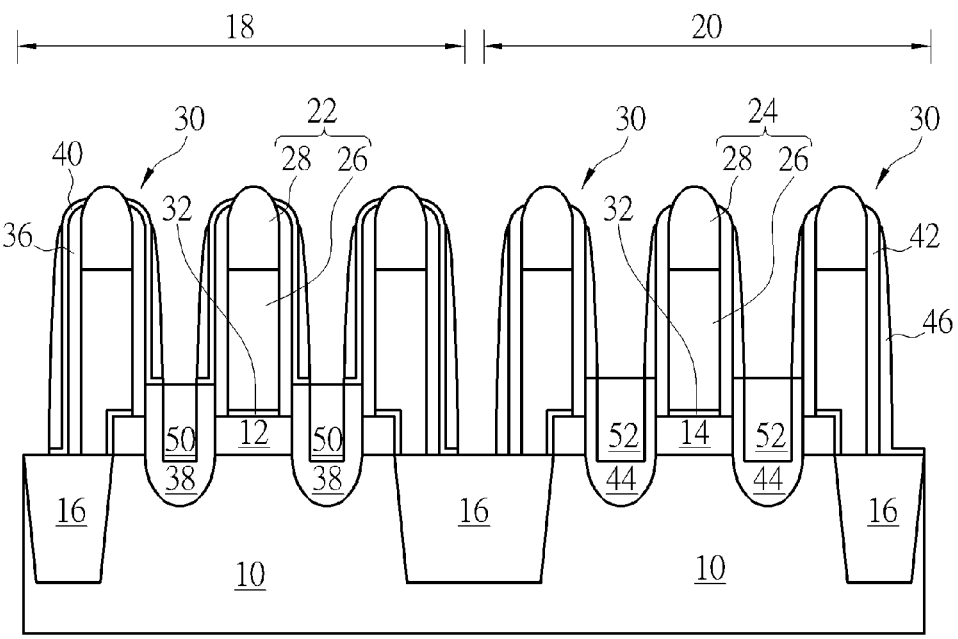

Next, as shown in FIG. 7, an oxide seal 48 is covered on the second spacer 46, the first gate structure 22, and the second gate structure 24, and as shown in FIG. 8, an ion implantation is performed to form source/drain regions in the PMOS region 18 and the NMOS region 20. For instance, a patterned resist (not shown) could be covered on the NMOS region 20, and a p-type ion implantation is conducted in the PMOS region 18 to form a source/drain region 50 in the first epitaxial layer 38 adjacent to the first gate structure 22. After stripping the patterned resist from the NMOS region 20, another patterned resist (not shown) is formed on the PMOS region 18 and an n-type ion implantation is performed in the NMOS region 20 to form a source/drain region 52 in the second epitaxial layer 44 adjacent to the second gate structures 24. The patterned resist in the PMOS region 18 is then stripped thereafter.

After forming the source/drain regions 50 and 52, diluted hydrofluoric acid (DHF) is used to remove the oxide seal 48 from the first gate structure 22, the second gate structure 24 and the second spacer 46. Typically, a wet clean through the utilization of HCl is carried out to remove polymers from the surface of the substrate after the source/drain regions 50, 52 are formed and after the patterned resist is stripped. Through the formation of the aforementioned oxide seal 48, the first epitaxial layer 38 and the second epitaxial layer 44 are protected throughout the wet clean process.

Figure 9:
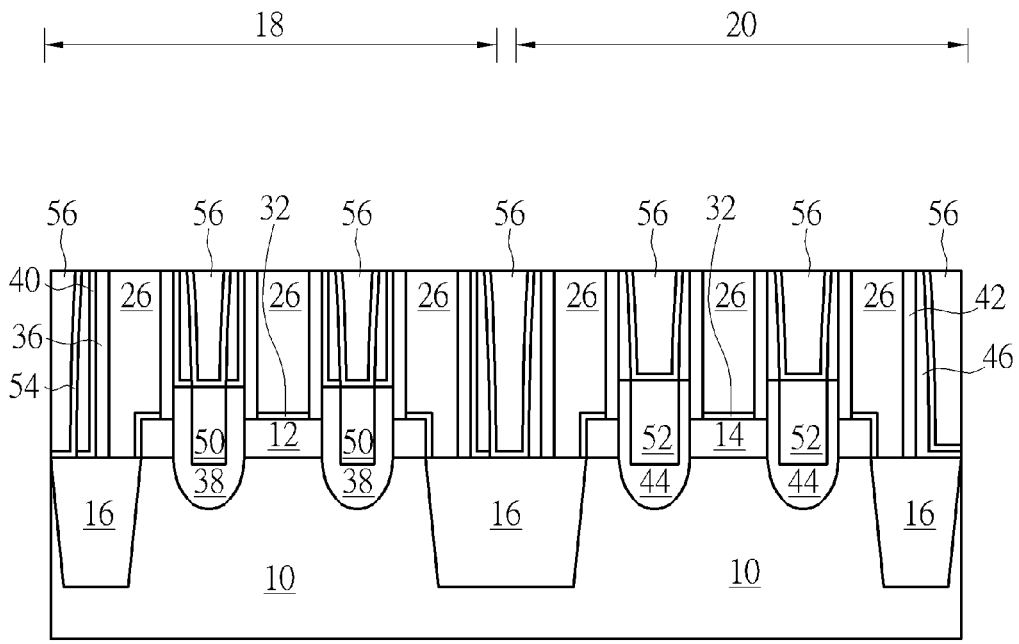

Next, as shown in FIG. 9, a contact etch stop layer (CESL) is deposited on the first gate structure 22, second gate structure 24, and second spacer 46 of the PMOS region 18 and the NMOS region 20. Next, a flowable chemical vapor deposition, FCVD) is carried out to form an interlayer dielectric (ILD) layer 56 on the CESL 54. A planarizing process, such as a chemical mechanical polishing (CMP) process is performed to partially remove the ILD layer 56, CESL 54, and hard mask 28 so that the top of the gate electrode 26 composed of polysilicon within the first gate structure 22 and the second gate structure 24 is exposed and substantially even with the surface of the ILD layer 56. Alternatively, another approach could be utilized by first performing a CMP process to partially remove the ILD layer 56 until reaching the CESL 54, and then using a dry etching process to partially remove the ILD layer 56, the CESL 54, and the hard mask 28 for exposing the top of the gate electrode 26, which is also within the scope of the present invention.

Figure 10:
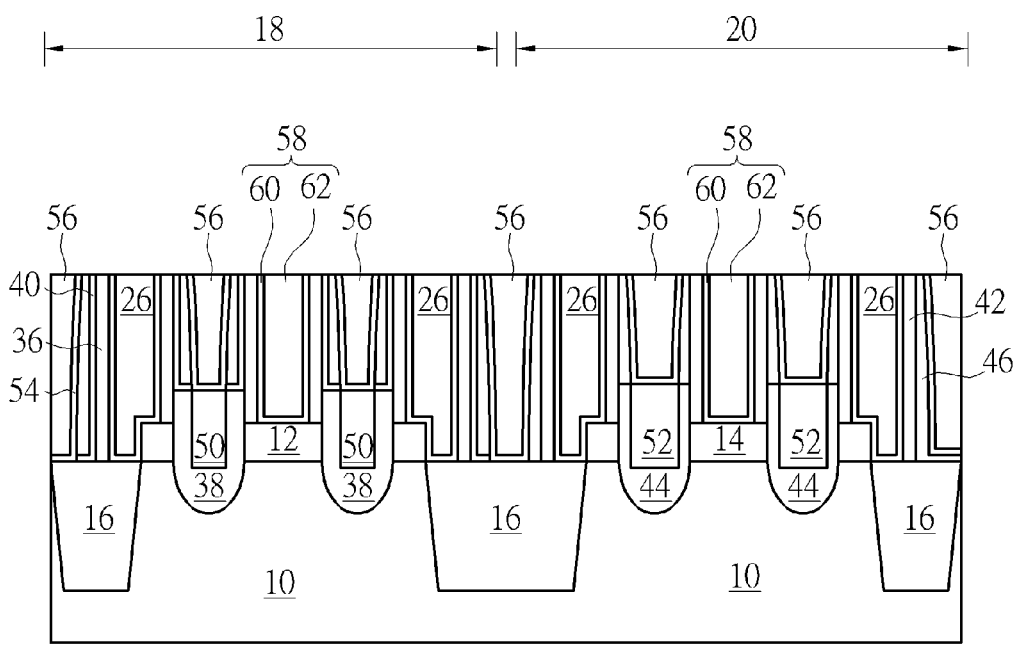

Next, as shown in FIG. 10, a replacement metal gate (RMG) process is conducted to form a metal gate 58 in each of the PMOS region 18 and the NMOS region 20, in which each metal gate 58 includes a high-k dielectric layer 60 and a work function metal layer 62.

According to a preferred embodiment of the present invention, the RMG process could be carried out by first performing a selective dry etching or wet etching process, such as using etchants including ammonium hydroxide ($NH_4OH$) or tetramethylammonium hydroxide (TMAH) to remove the polysilicon layer from the first gate structure 22 and the second gate structure 24 without etching the ILD layer 56 for forming a recess (not shown) in each transistor region 18 and 20. Next, a high-k dielectric layer 60 and an adequate work function metal layer 62 is deposited into the recess, and the layers 60 and 62 are planarized to form a metal gate 50 in each PMOS region 18 and NMOS region 20.

According to a preferred embodiment of the present invention, RMG process includes approaches such as gate first process, high-k first process from gate last process, high-k last process from gate last process, or polysilicon gate process. The present embodiment is preferably accomplished by the employment of high-k last process from the gate last process, hence the high-k dielectric layer 60 is preferably has a "U-shaped" cross section, and the high-k dielectric layer 60 could be made of dielectric materials having a dielectric constant (k value) larger than 4. The material of the high-k dielectric layer 60 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The high-k dielectric layer 60 can be formed through an atomic layer deposition (ALD) process or a metal-organic chemical vapor deposition (MOCVD) process, but is not limited thereto. Furthermore, a dielectric layer (not shown) such as a silicon oxide layer can be selectively formed between the substrate 10 and the high-k dielectric layer 60. The metal gate 58 contains one or a plurality of metal layer such as a work function metal layer 62, a barrier layer (not shown) and a low-resistance metal layer (not shown). The work function metal layer 62 is formed for tuning the work function of the later formed metal gates 58 to be appropriate in an NMOS or a PMOS. For an NMOS transistor, the work function metal layer 62 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 62 having a work function ranging between 4.8 eV and 5.2 eV may include titanium nitride (TiN), tantalum nitride (TaN), tantalum carbide (TaC), but it is not limited thereto. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Figure 11:
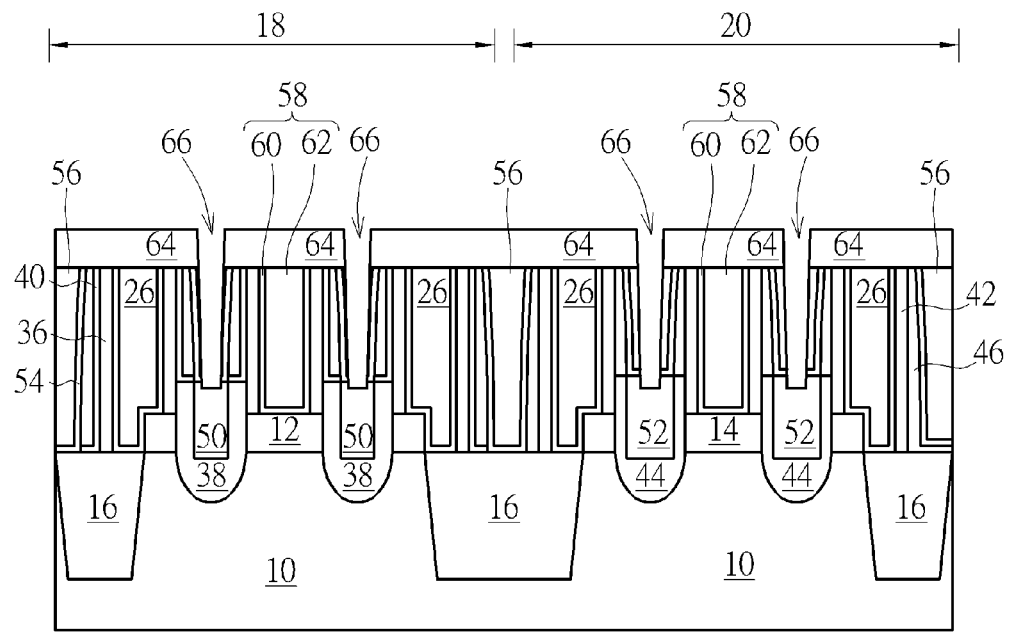

Next, as shown in FIG. 11, a cap film 64 is covered on the metal gates 58, in which the cap film 64 is preferably composed of oxides, but not limited thereto. A one-photo-one-etching (1P1E) or two-photo-two-etching (2P2E) process is then conducted to form a plurality of openings, such as contact holes 66 in the cap film 64 and the ILD layer 56 to expose the first epitaxial layer 38 and the second epitaxial layer 44.

Figure 12:
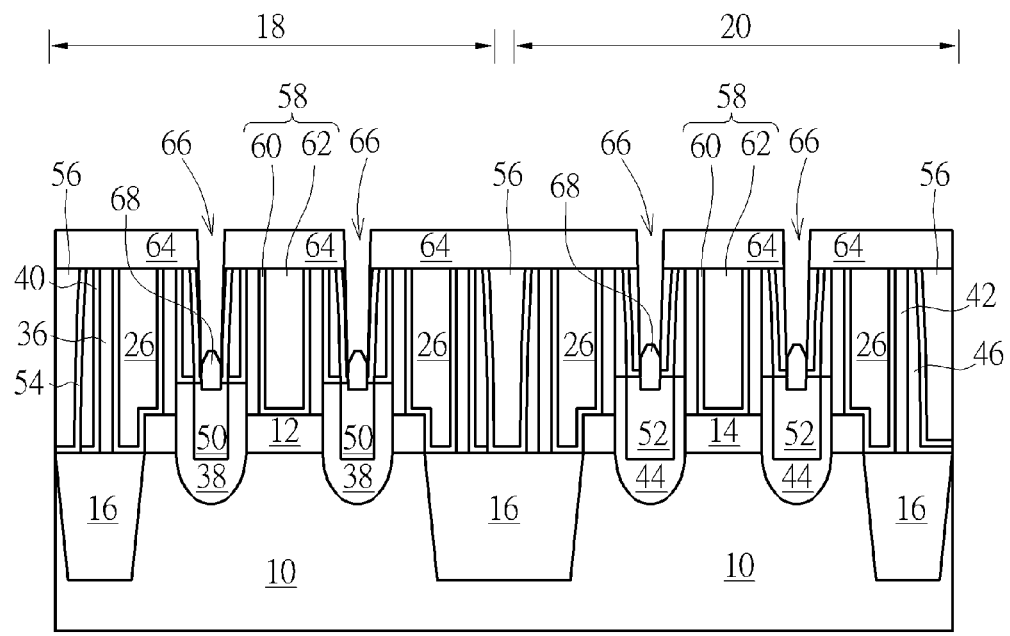

Next, as shown in FIG. 12, a silicon cap 68 is formed on top of the first epitaxial layer 38 and the second epitaxial layer 44. The silicon caps 68 are preferably consisted of pure silicon or silicon phosphorus, and the silicon caps 68 are preferably formed only on top of the first epitaxial layer 38 and second epitaxial layer 44 within each contact hole 66.

Figure 13:
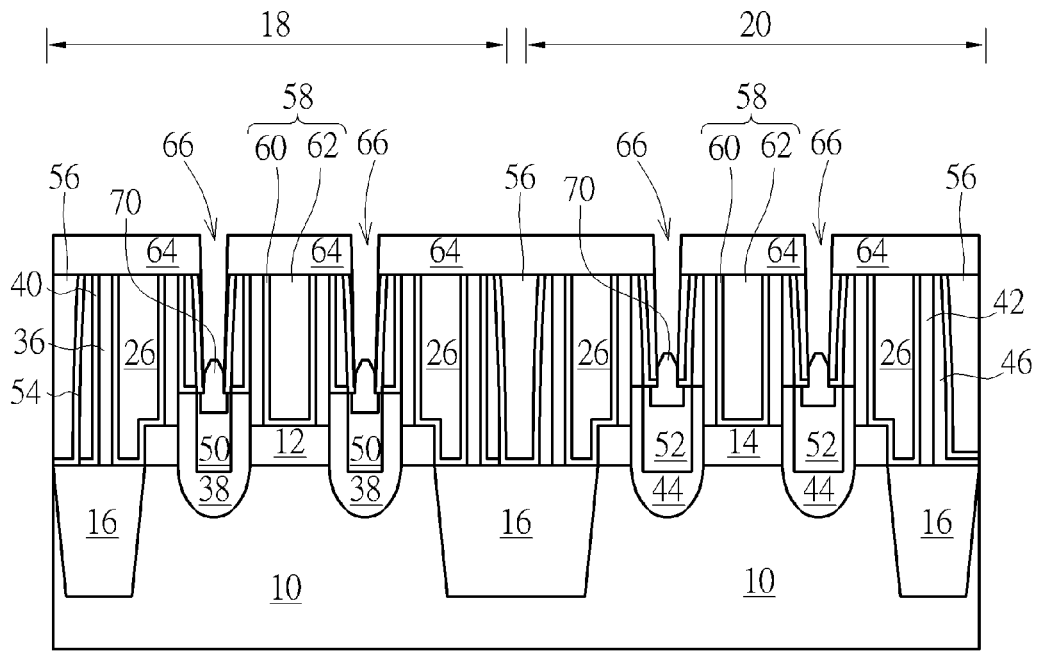

Next, as shown in FIG. 13, a salicide process is performed, such as by first depositing a metal layer (not shown) consisting of cobalt (Co), titanium (Ti), and/or nickel (Ni), or nickel platinum alloy (NiPt) into the contact holes 66, and a rapid thermal anneal (RTA) process is conducted to react the metal layer with silicon cap 68 for forming a silicide layer 70. According to a preferred embodiment of the present invention, the silicon cap 68 is preferably consumed entirely through the salicide process so that the resulting silicide layer 70 is grown directly on the two epitaxial layers.

Figure 14:
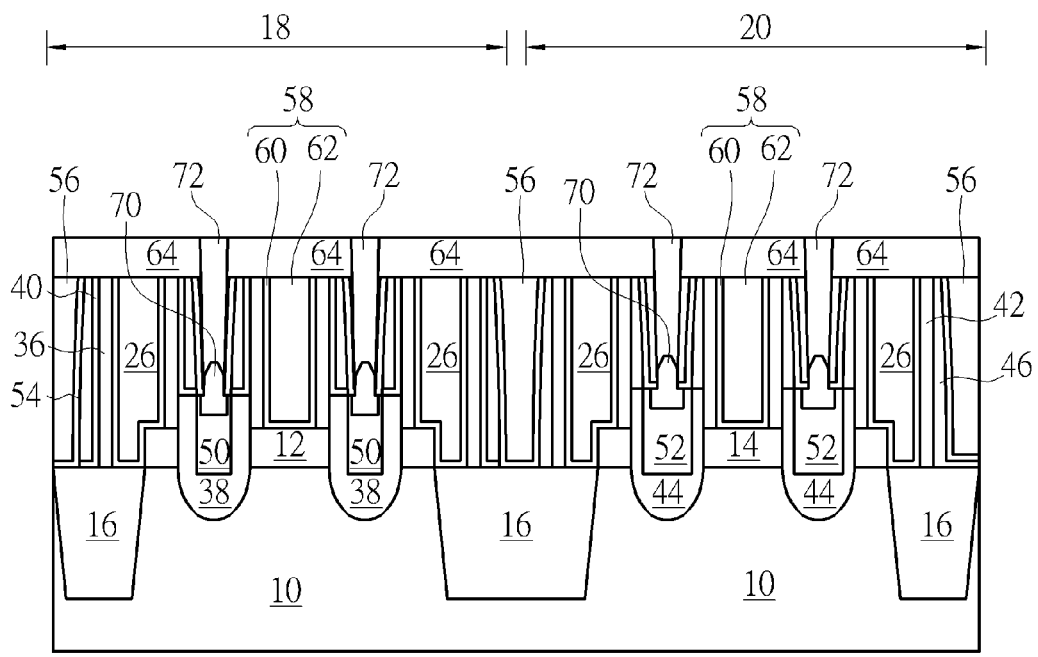

Next, as shown in FIG. 14, contact plugs 72 are further formed in the contact holes 66. The steps of forming the contact plugs 72 are described below. First, a barrier/adhesive layer (not shown), a seed layer (not shown) and a conductive layer (not shown) are sequentially formed to cover the cap film 64 and fill the contact holes 66, in which the barrier/adhesive layer are formed conformally along the surfaces of the contact holes 66, and the conductive layer is filled completely into the contact holes 66. The barrier/adhesive layer could be used for preventing metal elements of the conductive layer from diffusing into the neighboring cap film 64, and also increase the adhesiveness between the conductive layer and the cap film 64. The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and more preferably tungsten, which can form suitable Ohmic contact between the conductive layer and the metal silicide layer 70 or between the conductive layer and the source/drain regions 50, 52 underneath. Then, a planarization step, such as a chemical mechanical polish (CMP) process or an etching back process or combination thereof, can be performed to remove the barrier/adhesive layer, the seed layer and the conductive layer outside the contact holes 66, so that a top surface of a remaining conductive layer and the top surface of the cap film 64 are coplanar, thereby forming a plurality of contact plugs 72 and completing the fabrication of a FinFET according to a preferred embodiment of the present invention.

Overall, the present invention preferably moves the timing for forming the silicon cap, such as from after the formation of the epitaxial layer and the spacers to after the formation of contact holes and before the formation of silicide layers. By changing the timing for forming the silicon cap, issues such as bumps being formed on the surface of the polysilicon gate electrode could be avoided and drawbacks including encroachment and nickel silicide piping caused during salicide process could also be prevented effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating fin-shaped field-effect transistor (FinFET), comprising:
    providing a substrate;
    forming a fin-shaped structure on the substrate;
    forming a first gate structure on the fin-shaped structure;
    forming a first epitaxial layer in the fin-shaped structure adjacent to the first gate structure;
    forming an interlayer dielectric layer on the first gate structure and the first epitaxial layer;
    forming an opening in the interlayer dielectric layer to expose the first epitaxial layer;
    forming a silicon cap on the first epitaxial layer; and
    forming a contact plug in the opening.

2. The method for fabricating FinFET of claim 1, further comprising forming a shallow trench isolation (STI) on the substrate and around the fin-shaped structure before forming the first gate structure.

3. The method for fabricating FinFET of claim 2, wherein the first gate structure comprises:
    a polysilicon layer on the fin-shaped structure and the STI; and
    a hard mask on the polysilicon layer.

4. The method for fabricating FinFET of claim 3, further comprising:
    forming the first gate structure on a first transistor region of the substrate and on the STI and a second gate structure on a second transistor region of the substrate and on the STI;
    forming a first hard mask on the first gate structure and the second gate structure;
    removing a portion of the first hard mask on the first transistor region to form a first spacer around the first gate structure and a first recess in the fin-shaped structure adjacent to the first gate structure;
    forming a first epitaxial layer in the first recess;
    forming a second hard mask on the first gate structure and the second gate structure;
    removing the second hard mask on the second transistor region to form another first spacer around the second gate structure and a second recess in the fin-shaped structure adjacent to the second gate structure; and
    forming a second epitaxial layer in the second recess.

5. The method for fabricating FinFET of claim 4, wherein the first transistor region is a PMOS region and the second transistor region is a NMOS region.

6. The method for fabricating FinFET of claim 4, wherein the first hard mask and the second hard mask is selected from a group consisting of SiC, SiON, SiN, SiCN, and SiBN.

7. The method for fabricating FinFET of claim 4, wherein the first epitaxial layer comprises silicon germanium and the second epitaxial layer comprises silicon phosphorus.

8. The method for fabricating FinFET of claim 4, further comprising removing the first spacer from the first gate structure and the second gate structure.

9. The method for fabricating FinFET of claim 4, further comprising:
   forming a second spacer around the first gate structure and the second gate structure;
   forming an oxide seal on the second spacer, the first gate structure, and the second gate structure;
   forming a source/drain region adjacent to the first gate structure and the second gate structure;
   removing the oxide seal;
   performing a replacement metal gate (RMG) process to form a metal gate in each of the first transistor region and the second transistor region;
   forming a cap film on the metal gate;
   forming the opening in the cap film and the interlayer dielectric layer to expose the first epitaxial layer and the second epitaxial layer;
   forming the silicon cap on the first epitaxial layer and the second epitaxial layer;
   forming a silicide layer on the first epitaxial layer and the second epitaxial layer; and
   forming the contact plug in the opening.

10. The method for fabricating FinFET of claim 9, further comprising using diluted hydrofluoric acid (DHF) for removing the oxide seal.

11. The method for fabricating FinFET of claim 9, wherein the RMG process comprises:
   removing the hard mask and polysilicon layer for forming a recess in each of the first gate structure and the second gate structure;
   forming a high-k dielectric layer in the recess;
   depositing a work function metal layer in the recess; and
   planarizing the work function metal layer and the high-k dielectric layer for forming the metal gate in each of the first transistor region and the second transistor region.

12. The method for fabricating FinFET of claim 9, wherein the cap film comprises oxide.

13. The method for fabricating FinFET of claim 9, wherein the step of forming the contact plug further comprises:
   forming a barrier layer in the opening;
   depositing a metal layer to fill the opening; and
   planarizing the metal layer and the barrier layer to form the contact plug in the opening.

14. The method for fabricating FinFET of claim 13, wherein the metal layer comprises tungsten.

* * * * *